United States Patent
Ho

(10) Patent No.: US 8,098,495 B2
(45) Date of Patent: Jan. 17, 2012

(54) ELECTROMAGNETIC INTERFERENCE FILTER

(75) Inventor: Ho Yan Ho, Hong Kong (HK)

(73) Assignee: EMIF Technology Limited, Hong Kong (HK)

( * ) Notice: Subject to any disclaimer, the term of this patent is extended or adjusted under 35 U.S.C. 154(b) by 0 days.

(21) Appl. No.: 13/018,366

(22) Filed: Jan. 31, 2011

(65) Prior Publication Data

US 2011/0199751 A1  Aug. 18, 2011

(30) Foreign Application Priority Data

Feb. 12, 2010  (CN) .................. 2010 2 0122367 U

(51) Int. Cl.
*H05K 7/00* (2006.01)
(52) U.S. Cl. ...................................... 361/760; 361/763
(58) Field of Classification Search .................. 361/760, 361/748, 118; 174/250, 253; 363/40, 48; 336/220
See application file for complete search history.

(56) References Cited

U.S. PATENT DOCUMENTS

| 4,761,623 | A | * | 8/1988 | Schneider | 333/167 |
| 5,818,705 | A | * | 10/1998 | Faulk | 363/48 |
| 7,606,052 | B2 | * | 10/2009 | Akagi | 363/40 |
| 2007/0081289 | A1 | * | 4/2007 | Pierce et al. | 361/118 |
| 2007/0257759 | A1 | * | 11/2007 | Lee et al. | 336/90 |
| 2008/0129438 | A1 | * | 6/2008 | Lee et al. | 336/220 |
| 2008/0190417 | A1 | * | 8/2008 | Abate et al. | 128/200.14 |

FOREIGN PATENT DOCUMENTS

| CN | 2798396 | 7/2006 |
| GB | 21357 | 0/1910 |
| GB | 1165471 | 10/1969 |
| SE | 8301920 | 4/1984 |

OTHER PUBLICATIONS

An extended European search report for EP application No. 11152845.1, Date Jun. 17, 2011.

* cited by examiner

*Primary Examiner* — Yuriy Semenenko

(57) ABSTRACT

A differential mode and common mode combination choke (DCCC) includes: a theta-shaped magnetic core including an essentially round magnetic ring and a magnetic plate engaged with magnetic ring across the area surrounded by the magnetic ring; and two common mode coils with the same number of turns and the same winding direction being wound around the magnetic ring. An EMI (electromagnetic interference) filter and an EMI filter module including the DCCC are also provided.

17 Claims, 6 Drawing Sheets

ELECTROMAGNETIC INTERFERENCE FILTER

CROSS-REFERENCE TO RELATED APPLICATIONS

This application claims the priority of Chinese Utility Model Application No. 201020122367.8, filed on Feb. 12, 2010; the contents of which is hereby incorporated by reference.

FIELD OF THE PATENT APPLICATION

The present patent application relates to an EMI (electromagnetic interference) filter and more particularly to an EMI filter with a Differential Mode and Common Mode Combination Choke (DCCC) that is capable of effectively suppressing EMI.

BACKGROUND

Nowadays it is common that a home or business electronic appliance is equipped with an EMI filter at the power input port so as to suppress the EMI, to prevent the conducted electromagnetic disturbances generated by this appliance from interfering with other electronic devices nearby, and to prevent conducted electromagnetic disturbances generated by the electronic devices nearby from interfering with the operation of the appliance. The design goal of an EMI filter includes suppressing the voltages corresponding to the EMI within a certain spectrum to meet various international EMC (electromagnetic compatibility) standards so that the product can pass the EMC certification tests.

FIG. 1 is a circuit diagram of a simple EMI filter according to a related art. Referring to FIG. 1, the EMI filter includes a common mode choke $L_{CM}$, a resistor R, and capacitors $C_X$, $C_Y$ and $C_{Y'}$.

FIG. 2 is a circuit diagram of a relatively complete EMI filter according to a related art. Referring to FIG. 2, the EMI filter includes a differential mode choke $L_{DM}$, a common mode choke $L_{CM}$, a resistor R, and capacitors $C_{X1}$, $C_{X2}$, $C_Y$ and $C_{Y'}$. When the interference voltages are relatively high, to make the product pass the certification tests, in addition to increasing the common mode inductance to suppress the common mode interference voltages, the differential mode choke is included in the EMI filter network, which has a clear effect on the suppression of the differential mode interference voltages.

However, including the differential mode choke into the EMI filter network will lead to the increase in volume, weight, cost and power loss of the EMI filter. Because of the wide usage and the great number of EMI filters, it is desirable to decrease the volume, weight, cost and power consumption of EMI filters.

SUMMARY

The present patent application is directed to an EMI filter. In one aspect, a differential mode and common mode combination choke is provided. The differential mode and common mode combination choke includes a theta-shaped magnetic core including an essentially round magnetic ring and a magnetic plate engaged with magnetic ring across the area surrounded by the magnetic ring; and two common mode coils with the same number of turns and the same winding direction being wound around the magnetic ring.

Two grooves may be formed on the magnetic ring and the magnetic plate is inserted into the grooves. The magnetic ring may be circular and the grooves may be formed across the diameter of the magnetic ring. The magnetic ring may be elliptical and the grooves may be formed across the minor diameter of the magnetic ring.

The magnetic core, which includes the magnetic ring and the magnetic plate, may be made of soft magnetic ferrite with relative permeability equal to or higher than 10000. The surface of the magnetic core may be sprayed with an insulating layer. The insulating layer may be made of epoxy.

In another aspect, an electromagnetic interference filter is provided. The electromagnetic interference filter includes a first resistor; a first capacitor; a second capacitor; a third capacitor; and a differential mode and common mode combination choke. The differential mode and common mode combination choke includes a theta-shaped magnetic core including an essentially round magnetic ring and a magnetic plate engaged with magnetic ring across the area surrounded by the magnetic ring; and two common mode coils with the same number of turns and the same winding direction being wound around the magnetic ring. The first resistor and the first capacitor are connected in parallel to each other and connected to the input port of the differential mode and common mode combination choke. The second capacitor and the third capacitor are connected in series and connected to the output port of the differential mode and common mode combination choke. The point where the second capacitor and the third capacitor connect is connected to the ground.

In yet another aspect, an electromagnetic interference filter module is provided. The electromagnetic interference filter module includes a metallic housing; an electromagnetic interference filter accommodated in the metallic housing; a socket; a fuse; and a switch. The socket, the fuse and the switch are electrically connected with the electromagnetic interference filter. The electromagnetic interference filter includes a first resistor; a first capacitor; a second capacitor; a third capacitor; and a differential mode and common mode combination choke. The differential mode and common mode combination choke includes a theta-shaped magnetic core including an essentially round magnetic ring and a magnetic plate engaged with magnetic ring across the area surrounded by the magnetic ring; and two common mode coils with the same number of turns and the same winding direction being wound around the magnetic ring. The first resistor and the first capacitor are connected in parallel to each other and connected to the input port of the differential mode and common mode combination choke. The second capacitor and the third capacitor are connected in series and connected to the output port of the differential mode and common mode combination choke. The point where the second capacitor and the third capacitor connect is connected to the ground.

BRIEF DESCRIPTIONS OF THE DRAWINGS

DETAILED DESCRIPTION

Reference will now be made in detail to a preferred embodiment of the EMI filter disclosed in the present patent application, examples of which are also provided in the following description. Exemplary embodiments of the EMI filter disclosed in the present patent application are described in detail, although it will be apparent to those skilled in the relevant art that some features that are not particularly important to an understanding of the EMI filter may not be shown for the sake of clarity.

Furthermore, it should be understood that the EMI filter disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 3A:
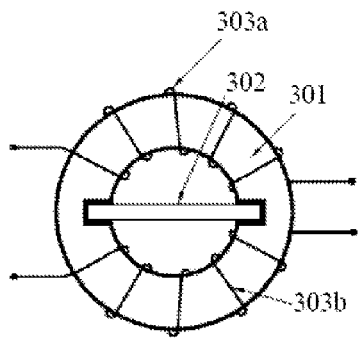
FIG. 3A illustrates a Differential Mode and Common Mode Combination Choke (DCCC) with a θ shaped magnetic core according to an embodiment of the present patent application.
Figure 3B:
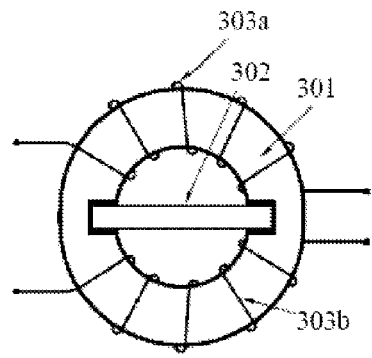
FIG. 3B illustrates another DCCC with a θ shaped magnetic core according to another embodiment of the present patent application.

FIG. 3A illustrates a Differential Mode and Common Mode Combination Choke (DCCC) with a θ shaped magnetic core according to an embodiment of the present patent application. FIG. 3B illustrates another DCCC with a θ shaped magnetic core according to another embodiment of the present patent application. Referring to FIG. 3A, the magnetic core includes a circular magnetic ring 301 and a magnetic plate (also referred to as magnetic bridge hereafter) 302. The magnetic ring 301 includes two grooves formed across the diameter of the inner circle of the magnetic ring 301. The magnetic plate 302 is inserted into the grooves. The θ shaped magnetic core is a combined magnetic core that has a shape of the Greek alphabet θ. In this embodiment, the θ shaped magnetic core, including the magnetic ring 301 and the magnetic plate 302, is made of soft magnetic ferrite with high relative permeability of $\mu_r \geqq 10000$. The surface of the θ shaped magnetic core is sprayed with an insulating layer of epoxy. Referring to FIG. 3B, the magnetic ring has an elliptical shape, and the grooves accommodating the magnetic plate 302 are formed across the minor diameter of the magnetic ring. It is understood the magnetic ring may have other essentially round shapes and the magnetic plate is engaged with the magnetic ring across the area surrounded by the magnetic ring.

Referring to FIG. 3A and FIG. 3B, the DCCC includes the θ shaped magnetic core and two common mode coils 303a and 303b wound around the θ shaped magnetic core. The common mode coils 303a and 303b have the same number of turns and the same winding direction. Because the magnetic plate (bridge) 302 forms a magnetic path, the DCCC not only has a common mode inductance value $L_{CM}$ that meets the design requirements, but also has a relatively large differential mode inductance value $L_{DM}$. Preferably, $L_{DM} \approx 0.05 L_{CM}$.

Figure 1:
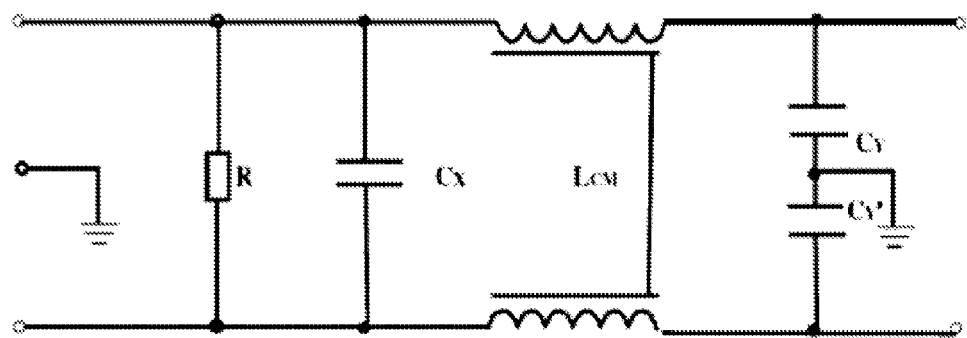
FIG. 1 is a circuit diagram of a simple EMI filter according to a related art.
Figure 2:
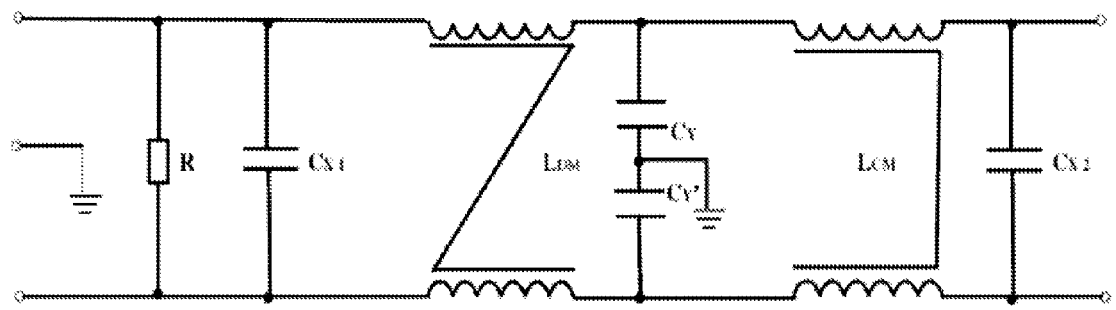
FIG. 2 is a circuit diagram of a relatively complete EMI filter according to a related art.
Figure 4:
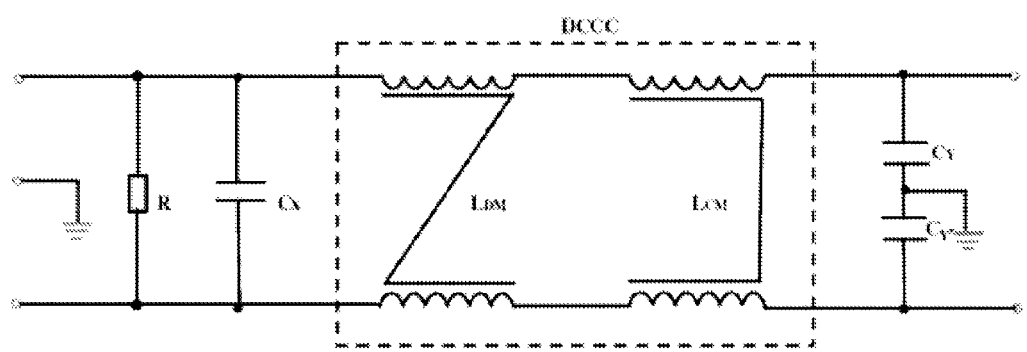
FIG. 4 is an equivalent circuit schematic diagram of the DCCC according to yet another embodiment of the present patent application.

FIG. 4 is an equivalent circuit schematic diagram of the DCCC according to yet another embodiment of the present patent application. Referring to FIG. 4, the EMI filter includes a DCCC, a first resistor R, a first capacitor $C_X$, a second capacitor $C_Y$, and a third capacitor $C_{Y'}$. The first resistor R and the first capacitor $C_X$ are connected in parallel to each other and connected to the input port of the DCCC. The second capacitor $C_Y$ and the third capacitor $C_{Y'}$ are connected in series and connected to the output port of the DCCC. The point where the second capacitor $C_Y$ and the third capacitor $C_{Y'}$ connect is connected to the ground. According to the technical requirements of the EMI filter, the values of the resistor R and the capacitors $C_X$ and $C_Y$ may normally be chosen from the following range: R=1~2 MΩ, $C_X$=0.1~1.0 μF, $C_Y \leqq 10$ nF. As an essential component of the EMI filter, the DCCC is designed and manufactured according to the operating current of the EMI filter and the required common mode inductance. FIG. 4 is an equivalent circuit schematic diagram of an EMI filter according to yet another embodiment of the present patent application. In this embodiment, only one DCCC is used. The discrete differential mode inductance $L_{DM}$ and the common mode inductance $L_{CM}$ in FIG. 4 are equal to the $L_{DM}$ and the $L_{CM}$ of the DCCC respectively. Compared to the EMI filter illustrated in FIG. 1, because the DCCC has a relatively large $L_{DM}$, the DCCC is capable of suppressing the differential mode interference voltages more strongly. Compared to the EMI filter illustrated in FIG. 2, a differential mode choke is eliminated in this embodiment and thereby the EMI filter's volume, weight, cost, and power loss are reduced.

Figure 5A:
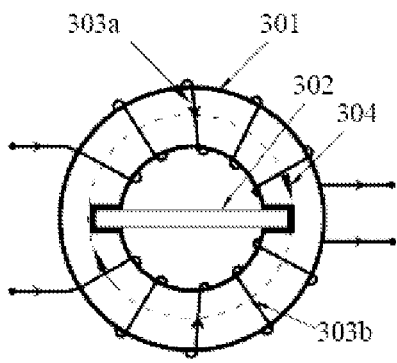
FIG. 5A illustrates the working principle of the DCCC under common mode interference currents according to still another embodiment of the present patent application.
Figure 5B:
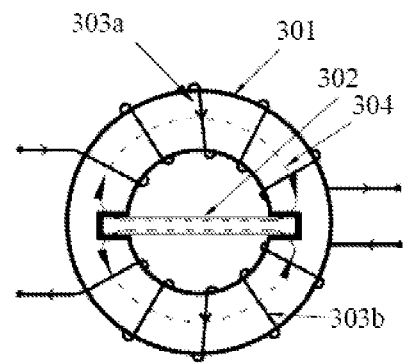
FIG. 5B illustrates the working principle of the DCCC under differential mode interference currents according to still another embodiment of the present patent application.
Figure 6A:
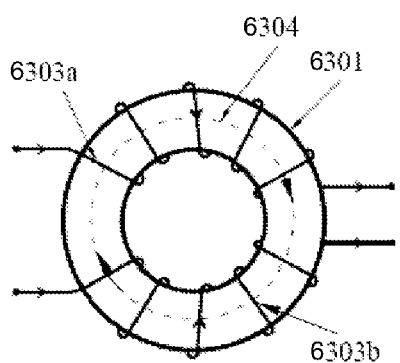
FIG. 6A illustrates the working principle of a common mode choke under common mode interference currents according to a related art.
Figure 6B:
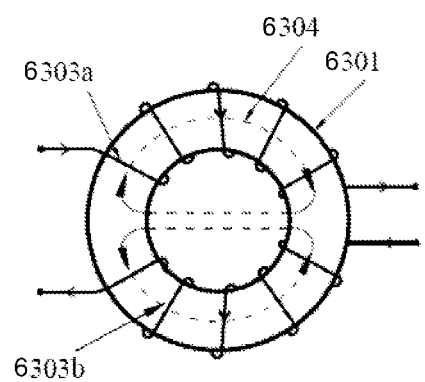
FIG. 6B illustrates the working principle of a common mode choke under differential mode interference currents according to a related art.

FIG. 5A illustrates the working principle of the DCCC under common mode interference currents according to still another embodiment of the present patent application. FIG. 5B illustrates the working principle of the DCCC under differential mode interference currents according to still another embodiment of the present patent application. FIG. 6A illustrates the working principle of a common mode choke under common mode interference currents according to a related art. FIG. 6B illustrates the working principle of a common mode choke under differential mode interference currents according to a related art. Referring to FIG. 5A and FIG. 6A, under common mode interference currents, the working of the DCCC is the same as the common mode choke in the related art. More specifically, the magnetic fluxes 304 (6304) generated by the common mode interference currents flowing through the two coils 303a (6303a) and 303b (6303b) have the same direction in the magnetic ring 301 (6301) and hence the magnetic fluxes 304 (6304) go through the coils 303a (6303a) and 303b (6303b) forming a single loop. Because the magnetic resistance of the loop is relatively small, the common mode inductance $L_{CM}$ is relative large. Referring to FIG. 5B and FIG. 6B, under differential mode interference currents, the working of the DCCC is different from the common mode choke in the related art. More specifically, the magnetic fluxes 304 (6304) generated by the differential mode interference currents flowing through the two coils 303a (6303a) and 303b (6303b) have opposite directions in the magnetic ring 301 (6301) and hence the magnetic fluxes 304 (6304) go through the two coils 303a (6303a) and 303b (6303b) respectively forming two different loops. In the DCCC, as shown in FIG. 5B, the loop formed by the magnetic flux 304 generated by the coil 303a or the coil 303b includes the magnetic bridge 302. Because the magnetic resistance of the magnetic bridge 302 is relatively small, the differential mode inductance $L_{DM}$ is relatively large. In the common mode choke according to the related art, as shown in FIG. 6B, the loop formed by the magnetic flux 6304 generated by the coil 6303a or the coil 6303b includes a length of air. Because the magnetic resistance of the air is relatively large, the differential mode inductance in the related art is relatively small. For the DCCC according to this embodiment, the ratio between the differential mode inductance and the common mode inductance is $L_{DM}/L_{CM} \approx 5\%$. For the common mode choke according to the related art, this ratio is only $L_{DM}/L_{CM} \approx (0.5~1.5)\%$.

In the above embodiments, the DCCC is equivalent to the combination of the discrete differential mode choke $L_{DM}$ and the common mode choke $L_{CM}$, which brings to the following advantages. The volume and weight of the EMI filter as well as the area of the circuit board thereof are reduced. The raw materials for manufacturing the EMI filter are saved and the cost is reduced. The power loss and the temperature rise are reduced and the efficiency of the EMI filter is improved. The performance of the EMI filter is improved and the electromagnetic pollution of the electronic appliance to the environment is reduced.

The design steps of the EMI filter according to still another embodiment of the present patent application are described hereafter. The values of the resistor R and the capacitors $C_X$ and $C_Y$ are first determined according to the technical requirements of the EMI filter. The method of designing the DCCC includes the following:
1. Select the material and size of the θ shaped magnetic core according to the operating current I(A) of the EMI filter and the required common mode inductance $L_{CM}$(H).
2. Calculate the number of turns of the common mode coils of the DCCC. Suppose the inductance factor is AL(nH/N²), in which the AL value is provided by the manufacturer of the magnetic core, then:

$$N = \sqrt{\frac{L_{CM}}{AL \times 10^{-9}}},$$

where N is the number of turns of the common mode coils of the DCCC.
3. Select the diameter of the copper wires wound around the magnetic core. Suppose the number of the copper wires wound together is n, when the current density is $j_{Cu}$(A/mm²), $$d_{Cu} = 1.13\sqrt{\frac{I}{nj_{Cu}}} \text{ (mm)},$$

where $d_{Cu}$ is the diameter of the copper wires wound around the magnetic core. It is noted that $j_{Cu}$ should be selected to ensure the temperature rise of the DCCC would not exceed the standard specified by the international standard IEC 1046.

Figure 7A:
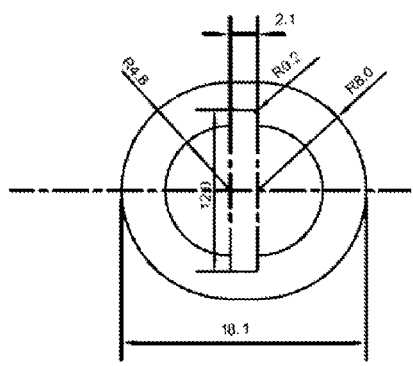
FIG. 7A shows the geometry of the magnetic ring with the grooves of the θ shaped magnetic core according to an embodiment of the present patent application.
Figure 7B:
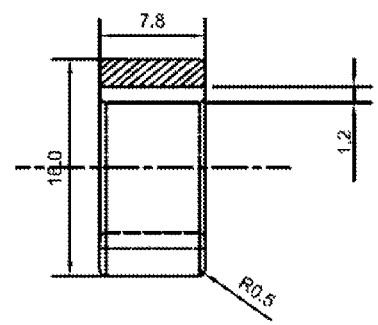
FIG. 7B shows the dimensions of the magnetic ring depicted in FIG. 7A.
Figure 8A:
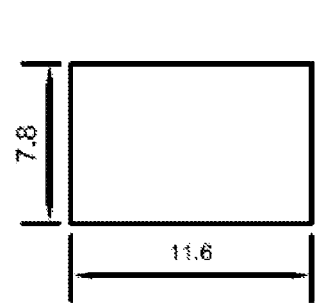
FIG. 8A shows the geometry of the magnetic bridge of the θ shaped magnetic core according to an embodiment of the present patent application.
Figure 8B:
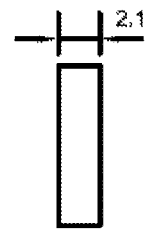
FIG. 8B shows the dimensions of the magnetic bridge depicted in FIG. 8A.

As an example illustrating the above-mentioned design steps, suppose an EMI filter with V=115/250V, I=3 A and $L_{CM}$=2.7×10⁻³ H, the values of the resistor R and the capacitors $C_X$ and $C_Y$ may be first determined within a regular range: R=1-2MΩ, $C_X$=0.1-1.0 μF, $C_Y \leq$10 nF. For example, R=1.0 MΩ 0.25 W, $C_X$=0.22 μF 275 $V_{ac}$, and $C_Y$=4.7 nF 275 $V_{ac}$. The design steps of the DCCC include the following:
1. Select the material and size of the θ shaped magnetic core. For example, the magnetic ring and magnetic bridge use soft magnetic ferrite with high relative permeability of $\mu_r \geq$10000.
FIG. 7A shows the geometry of the magnetic ring with the grooves of the θ shaped magnetic core according to an embodiment of the present patent application. FIG. 7B shows the dimensions of the magnetic ring depicted in FIG. 7A. The radius of the outer circle is 8.0 mm. The radius of the inner circle is 4.8 mm. The height is 7.8 mm. The width of the groove is 2.1 mm. The depth of the groove is 1.2 mm.
FIG. 8A shows the geometry of the magnetic bridge of the θ shaped magnetic core according to an embodiment of the present patent application. FIG. 8B shows the dimensions of the magnetic bridge depicted in FIG. 8A. The length of the magnetic bridge is 11.6 mm, the width is 7.8 mm and the thickness is 2.1 mm
2. Calculate the number of turns of the common mode coils of the DCCC. The inductance factor is AL=5000nH/N²±30%.

$$N = \sqrt{\frac{L_{CM}}{AL \times 10^{-9}}} = \sqrt{\frac{2.7 \times 10^{-3}}{5000 \times 10^{-9}}} \approx 23 \text{ (turns)}$$

3. Select the diameter of the copper wires wound around the magnetic core. In this example, a single wire is wound around the magnetic core, so n=1. The current density is chosen to be: $j_{Cu}$=15 A/mm². Hence, $$d_{Cu} = 1.13\sqrt{\frac{I}{nj_{Cu}}} = 1.13\sqrt{\frac{3}{1 \times 15}} \approx 0.5 \text{ mm}$$

The test results of the above example are the following:
Common mode inductance (at 10 KHz 100 mV 25° C.): $L_{CM}$=2.6 mH
Differential mode inductance (at 10 KHz 100 mV 25° C.): $L_{DM}$=0.12 mH
DC resistance (at 25° C.): DCR=53 mΩ
Temperature rise of the coils during operation (at 40° C.): ΔT=56° C.

The manufacturing process of an EMI filter according to still another embodiment of the present patent application is the following.
1. Preparing the required resistor R and the capacitors $C_X$ and $C_Y$.
2. Manufacturing the DCCC:
1) At the windows at the two sides of the magnetic bridge of the θ shaped magnetic core, wind n lacquered wires with a diameter of $d_{Cu}$ around the magnetic core into two common mode coils with the same turning direction and the turn number N.

2) Place the assembly onto a base and weld the leads of the common mode coils onto the designated pins;

3) Test the electrical parameters and inspect the exterior condition of the DCCC.

Figure 9A:
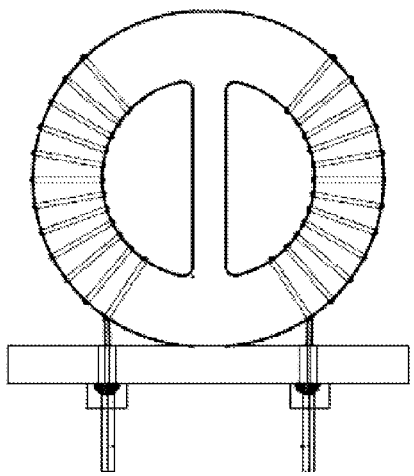
FIG. 9A shows a front view of a vertical type DCCC according to an embodiment of the present patent application.
Figure 9B:
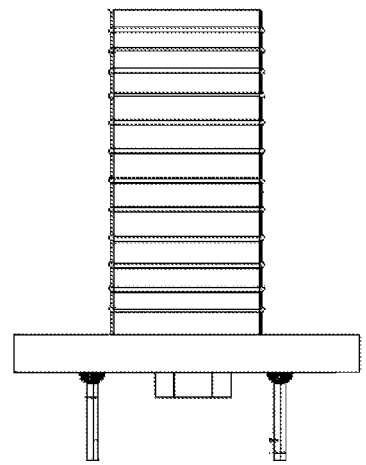
FIG. 9B shows a side view of the vertical type DCCC depicted in FIG. 9A.
Figure 9C:
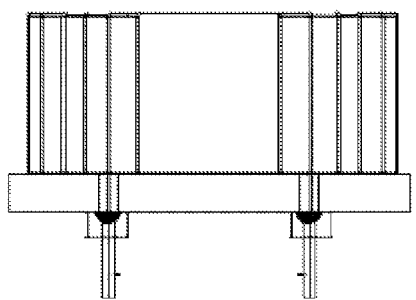
FIG. 9C shows a front view of a horizontal type DCCC according to an embodiment of the present patent application.
Figure 9D:
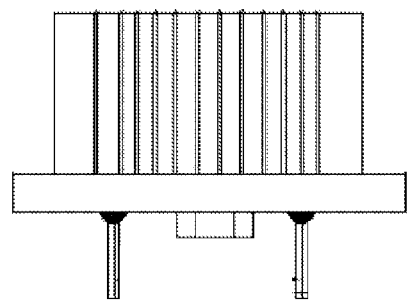
FIG. 9D shows a side view of the horizontal type DCCC depicted in FIG. 9C.

FIG. 9A shows a front view of a vertical type DCCC according to an embodiment. FIG. 9B shows a side view of the vertical type DCCC depicted in FIG. 9A. FIG. 9C shows a front view of a horizontal type DCCC according to an embodiment. FIG. 9D shows a side view of the horizontal type DCCC depicted in FIG. 9C. A user may choose one of these types of DCCC according to the specific application scenario.

3. According to the circuit schematic diagram of FIG. 4, assemble the DCCC, the resistor R and the capacitors $C_X$ and $C_Y$ into an EMI filter at the power input port of the circuit board of an electronic device or appliance.

Figure 10A:
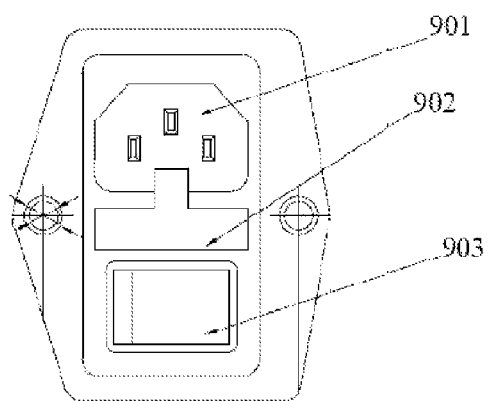
FIG. 10A is a front view of an EMI filter module according to an embodiment of the present patent application.
Figure 10B:
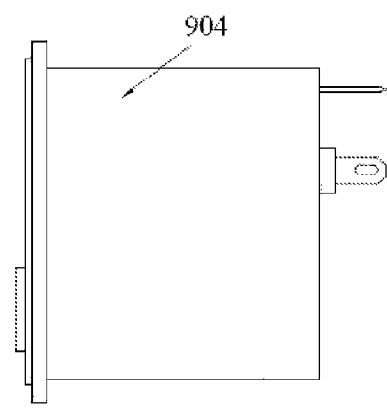
FIG. 10B is a side view of the EMI filter module depicted in FIG. 10A.

4. Place the EMI filter into a metallic housing and connect the EMI filter with an IEC socket, a fuse and/or a switch, thus making an EMI filter module. FIG. 10A is a front view of an EMI filter module according to an embodiment of the present patent application. FIG. 10B is a side view of the EMI filter module depicted in FIG. 10A. Referring to FIG. 10A and FIG. 10B, the EMI filter module includes an IEC socket 901, a fuse 902, a switch 903, a metallic housing 904 and the EMI filter disposed in the metallic housing 904. It is understood that the IEC socket 901, the fuse 902, and the switch 903 are electrically connected with the EMI filter.

While the present patent application has been shown and described with particular references to a number of embodiments thereof, it should be noted that various other changes or modifications may be made without departing from the scope of the present invention.

What is claimed is:

1. An electromagnetic interference filter comprising:
   a first resistor;
   a first capacitor;
   a second capacitor;
   a third capacitor; and
   a differential mode and common mode combination choke comprising:
      a theta-shaped magnetic core comprising an essentially round magnetic ring and a magnetic plate engaged with magnetic ring across the area surrounded by the magnetic ring; and
      two common mode coils with the same number of turns and the same winding direction being wound around the magnetic ring; wherein:
   the first resistor and the first capacitor are connected in parallel to each other and connected to the input port of the differential mode and common mode combination choke;
   the second capacitor and the third capacitor are connected in series and connected to the output port of the differential mode and common mode combination choke;
   the point where the second capacitor and the third capacitor connect is connected to the ground;
   wherein two grooves are formed on the magnetic ring and the magnetic plate is inserted into the grooves.

2. The electromagnetic interference filter of claim 1, wherein the magnetic ring is circular and the grooves are formed across the diameter of the magnetic ring.

3. The electromagnetic interference filter of claim 1, wherein the magnetic ring is elliptical and the grooves are formed across the minor diameter of the magnetic ring.

4. The electromagnetic interference filter of claim 1, wherein the magnetic core, which comprises the magnetic ring and the magnetic plate, is made of a soft magnetic ferrite with relative permeability equal to or higher than 10000.

5. The electromagnetic interference filter of claim 1, wherein the surface of the magnetic core is sprayed with an insulating layer.

6. The electromagnetic interference filter of claim 5, wherein the insulating layer is made of epoxy.

7. An electromagnetic interference filter module comprising:
   a metallic housing;
   an electromagnetic interference filter accommodated in the metallic housing;
   a socket;
   a fuse; and
   a switch; wherein:
   the socket, the fuse and the switch are electrically connected with the electromagnetic interference filter;
   the electromagnetic interference filter comprising:
   a first resistor;
   a first capacitor;
   a second capacitor;
   a third capacitor; and
   a differential mode and common mode combination choke comprising:
      a theta-shaped magnetic core comprising an essentially round magnetic ring and a magnetic plate engaged with magnetic ring across the area surrounded by the magnetic ring; and
      two common mode coils with the same number of turns and the same winding direction being wound around the magnetic ring; wherein:
   the first resistor and the first capacitor are connected in parallel to each other and connected to the input port of the differential mode and common mode combination choke;
   the second capacitor and the third capacitor are connected in series and connected to the output port of the differential mode and common mode combination choke;
   the point where the second capacitor and the third capacitor connect is connected to the ground.
   wherein two grooves are formed on the magnetic ring and the magnetic plate is inserted into the grooves.

8. The electromagnetic interference filter module of claim 7, wherein the magnetic ring is circular and the grooves are formed across the diameter of the magnetic ring.

9. The electromagnetic interference filter module of claim 7, wherein the magnetic ring is elliptical and the grooves are formed across the minor diameter of the magnetic ring.

10. The electromagnetic interference filter module of claim 7, wherein the magnetic core, which comprises the magnetic ring and the magnetic plate, is made of a soft magnetic ferrite with relative permeability equal to or higher than 10000.

11. The electromagnetic interference filter module of claim 7, wherein the surface of the magnetic core is sprayed with an insulating layer made of epoxy.

12. A differential mode and common mode combination choke comprising:
   a theta-shaped magnetic core comprising an essentially round magnetic ring and a magnetic plate engaged with magnetic ring across the area surrounded by the magnetic ring; and
   two common mode coils with the same number of turns and the same winding direction being wound around the magnetic ring;

wherein two grooves are formed on the magnetic ring and the magnetic plate is inserted into the grooves.

13. The differential mode and common mode combination choke of claim 12, wherein the magnetic ring is circular and the grooves are formed across the diameter of the magnetic ring.

14. The differential mode and common mode combination choke of claim 12, wherein the magnetic ring is elliptical and the grooves are formed across the minor diameter of the magnetic ring.

15. The differential mode and common mode combination choke of claim 12, wherein the magnetic core, which comprises the magnetic ring and the magnetic plate, is made of a soft magnetic ferrite with relative permeability equal to or higher than 10000.

16. The differential mode and common mode combination choke of claim 12, wherein the surface of the magnetic core is sprayed with an insulating layer.

17. The differential mode and common mode combination choke of claim 16, wherein the insulating layer is made of epoxy.

* * * * *